(12) United States Patent
Cheng et al.

(10) Patent No.: US 10,735,133 B2
(45) Date of Patent: Aug. 4, 2020

(54) METHOD AND APPARATUS FOR CONFIGURABLE MIMO PROCESSING IN WIRELESS COMMUNICATIONS

(71) Applicant: PERASO TECHNOLOGIES INC., Toronto (CA)

(72) Inventors: Gary Cheng, Unionville (CA); Joseph Andonieh, Aurora (CA); Bradley Robert Lynch, Toronto (CA); Christopher James Hansen, Los Altos, CA (US)

(73) Assignee: PERASO TECHNOLOGIES INC., Toronto (CA)

( * ) Notice: Subject to any disclaimer, the term of this patent is extended or adjusted under 35 U.S.C. 154(b) by 4 days.

(21) Appl. No.: 16/028,135

(22) Filed: Jul. 5, 2018

(65) Prior Publication Data

US 2019/0013896 A1    Jan. 10, 2019

Related U.S. Application Data

(60) Provisional application No. 62/529,140, filed on Jul. 6, 2017.

(51) Int. Cl.
*H04L 1/00* (2006.01)
*H04L 1/06* (2006.01)
(Continued)

(52) U.S. Cl.
CPC ......... *H04L 1/0005* (2013.01); *H03M 13/116* (2013.01); *H04B 7/0413* (2013.01);
(Continued)

(58) Field of Classification Search
CPC ..... H04L 1/005; H04L 1/0011; H04L 1/0048; H04L 1/0058; H04L 1/0063; H04L 27/20;
(Continued)

(56) References Cited

U.S. PATENT DOCUMENTS

2007/0086539 A1\* 4/2007 Hocevar
2010/0077275 A1\* 3/2010 Yu et al.
2016/0344523 A1\* 11/2016 Srnvasa et al.

FOREIGN PATENT DOCUMENTS

WO    WO-2008085015 A1    7/2008

OTHER PUBLICATIONS

EPO, Extended European Search Report, dated Dec. 6, 2018, re European Patent Application No. 18181531.7.
(Continued)

*Primary Examiner* — Marsha D Banks Harold
*Assistant Examiner* — Dharmesh J Patel
(74) *Attorney, Agent, or Firm* — Perry + Currier (57) ABSTRACT

A method in a transmitter station includes: generating payload data for transmission to a receiver station via a plurality of antennae of the transmitter station; selecting a number of transmit streams for transmission of the payload data; selecting respective modulation schemes for each of the transmit streams; according to the modulation schemes and to an active one of (i) a single-encoder mode and (ii) a per-stream encoder mode, generating the number of coded, modulated transmit streams; wherein each coded, modulated transmit stream contains a portion of the payload data; and providing the coded, modulated transmit streams to respective ones of the antennae for transmission to the receiver station.

15 Claims, 4 Drawing Sheets

(51) Int. Cl.
*H04B 7/0413* (2017.01)
*H03M 13/11* (2006.01)

(52) U.S. Cl.
CPC .......... *H04L 1/0003* (2013.01); *H04L 1/0009* (2013.01); *H04L 1/0011* (2013.01); *H04L 1/0031* (2013.01); *H04L 1/0041* (2013.01); *H04L 1/0058* (2013.01); *H04L 1/0075* (2013.01); *H04L 1/06* (2013.01)

(58) Field of Classification Search
CPC ... H04L 27/36; H03M 13/112; H03M 13/116; H03M 13/1102; H03M 13/1111; H03M 13/1177; H03M 13/1188

See application file for complete search history.

(56) References Cited

OTHER PUBLICATIONS

Qualcomm Incorporated: "Multiuser superposition schemes", 3GPP Draft; R1-157075 Multiuser Superposition Schemes, 3rd Generation Partnership Project (3GPP), Mobile Competence Centre; 650, Route des Lucioles; F-06921 Sophia-Antipolis Cedex; France, vol. RAN WG1, No. Anaheim CA, USA; Nov. 16, 2015-Nov. 20, 2015 Nov. 15, 2015 (Nov. 15, 2015), Retrieved from the Internet: URL: http://www.3gpp.org/ftp/Meetings_3GPP_SYNC/RAN1/Docs/ [retrieved on Nov. 15, 2015].
Sandip Sarkar: "MIMO Design for LBC-FDD", 3GPP2 Draft; C30-20060911-072_QCOM_MIMO Design, 3rd Generation Partnership Project 2, 3GPP2, 2500 Wilson Blvd, Ste 300, Arlington, VA 22201; USA, vol. TSGC Sep. 14, 2006 (Sep. 14, 2006), pp. 1-15, Retrieved from the Internet: URL: http:/ftp.3gpp2.org/TSGC/Working/ 2006/2006-09-Xian/TSGC-2006-09/WG3/ [retrieved on Sep. 14, 2006].

* cited by examiner

METHOD AND APPARATUS FOR CONFIGURABLE MIMO PROCESSING IN WIRELESS COMMUNICATIONS

CROSS-REFERENCE TO RELATED APPLICATIONS

This application claims priority from U.S. provisional patent application No. 62/529,140 filed Jul. 6, 2017, the contents of which is incorporated herein by reference.

FIELD

The specification relates generally to wireless communications, and specifically to a method and apparatus for configurable multiple-input, multiple-output (MIMO) processing in wireless communications

BACKGROUND

Wireless devices operate in a wide variety of environments and may have a wide variety of capabilities (e.g. available computational resources). Thus, devices implementing a shared communications standard may nevertheless operate under disparate operational constraints. Technological adaptations suited to certain operational constraints may not be well-suited to others, and thus when devices operating according to the shared standard implement such adaptations, the result may be that some of the above-mentioned devices suffer from reduced performance when communicating with one another, or from an inability to establish communications.

SUMMARY

An aspect of the specification provides a method in a transmitter station, comprising: generating payload data for transmission to a receiver station via a plurality of antennae of the transmitter station; selecting a number of transmit streams for transmission of the payload data; selecting respective modulation schemes for each of the transmit streams; according to the modulation schemes and to an active one of (i) a single-encoder mode and (ii) a per-stream encoder mode, generating the number of coded, modulated transmit streams; wherein each coded, modulated transmit stream contains a portion of the payload data; and providing the coded, modulated transmit streams to respective ones of the antennae for transmission to the receiver station.

BRIEF DESCRIPTIONS OF THE DRAWINGS

Embodiments are described with reference to the following figures, in which.

DETAILED DESCRIPTION

Figure 1:
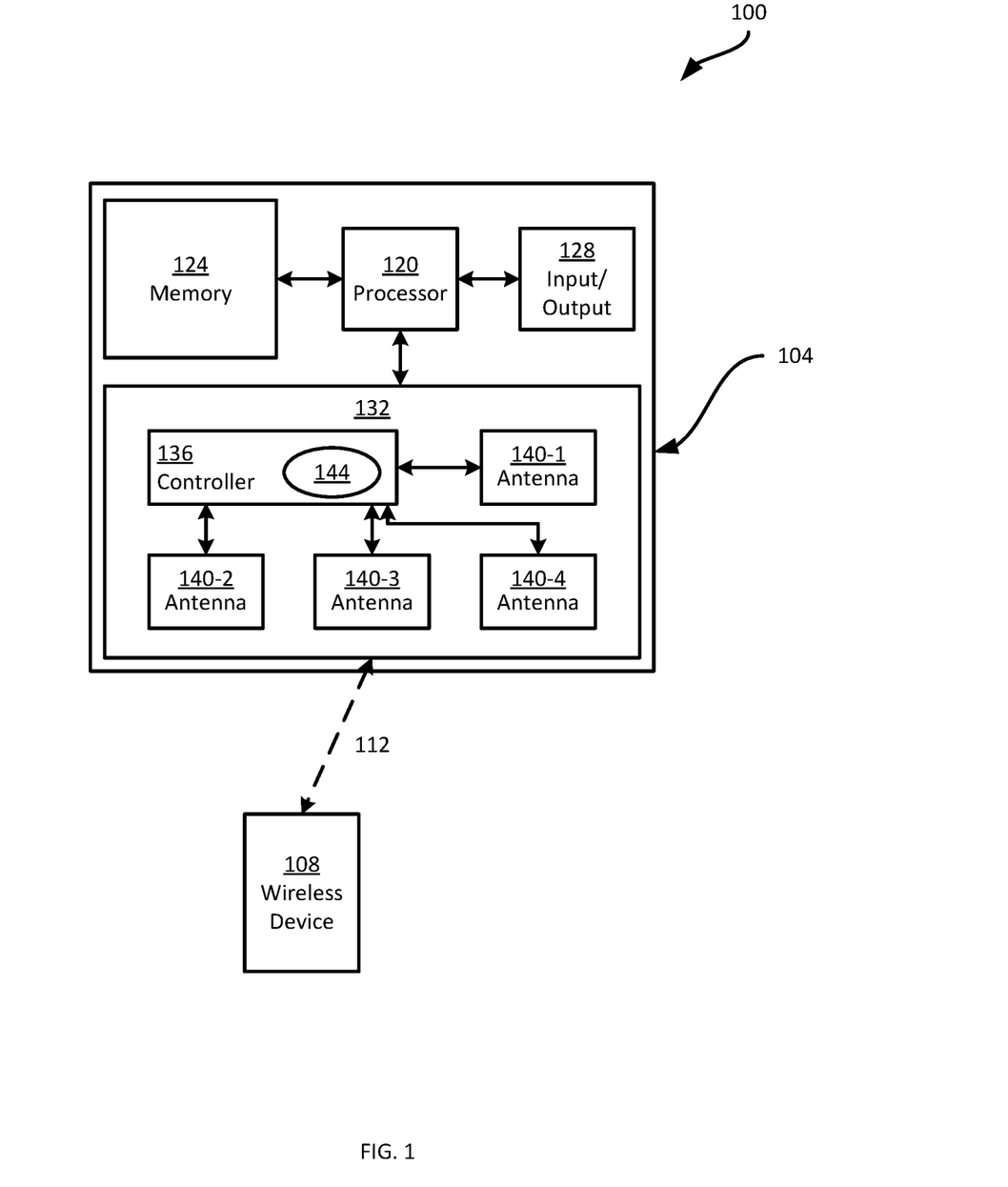
FIG. 1 depicts a wireless communications system.

FIG. 1 depicts a wireless communications system 100, including a plurality of wireless devices, also referred to as wireless stations. In particular, FIG. 1 illustrates a first device 104 connected with a second device 108. The system 100 can include additional devices in other embodiments. Each of the devices 104 and 108 can be implemented as a wireless access point (e.g. a router), a smart phone or other mobile device, a media server, a home computer, or the like. In the present example, the device 104 is referred to as a transmitting device, as functionality related to the transmission of data from the device 104 to the device 108 over a wireless link 112 (e.g. a direct link, a link implemented over a wireless local-area network (WLAN) or the like) will be discussed below. The device 108 will therefore also be referred to as the receiving device 108. As will be apparent to those skilled in the art, the device 104 is typically also configured to receive data, and the device 108 is also typically configured to transmit data. The In the examples discussed below the devices 104 and 108 each include a wireless communications assembly configured to implement a shared wireless communication standard. More specifically, the devices of the system 100 are each configured to communicate according to a wireless standard employing frequencies of around 60 GHz (also referred to as WiGig). Examples of such standards are the IEEE 802.11ad standard, and enhancements thereto (e.g. 802.11ay). As will be apparent, therefore, the devices of the system 100 employ a common set of carrier frequencies. For example, the 802.11ad and 802.11ay standards define four channels, having center frequencies of 58.32 GHz, 60.48 GHz, 62.64 GHz and 64.8 GHz, and bandwidths of 2.16 GHz. Certain specific components of the device 104 employed in the processing of data for transmission will be described in greater detail below. As will be apparent to those skilled in the art, such components may also be included in the device 108, and both devices 104 and 108 may also include further components (not shown) employed in the processing of received signals.

The device 104 includes a central processing unit (CPU), also referred to as a processor 120. The processor 120 is interconnected with a non-transitory computer readable storage medium, such as a memory 124, having stored thereon various computer readable instructions for performing various actions (e.g. streaming media to the device 108). The memory 124 includes a suitable combination of volatile memory (e.g. Random Access Memory or RAM) and non-volatile memory (e.g. read only memory or ROM, Electrically Erasable Programmable Read Only Memory or EEPROM, flash memory). The processor 120 and the memory 124 each comprise one or more integrated circuits.

The device 104 also includes one or more input devices, and one or more output devices, generally indicated as an input/output device 128. The input and output devices 128 serve to receive commands for controlling the operation of the device 104 and for presenting information, e.g. to an operator of the device 104. The input and output devices 128 therefore include any suitable combination of devices, including a keyboard, a mouse, a display, a touchscreen, a speaker, a microphone, and the like). In other embodiments, the input and output devices may be connected to the processor 120 via a network, or may simply be omitted.

The device 104 further includes a wireless communications assembly 132 interconnected with the processor 120. The assembly 132 enables the device 104 to communicate with other computing devices. In the present example, as noted earlier, the assembly 132 enables such communication according to the IEEE 802.11ay standard, and thus transmits and receives data at frequencies of around 60 GHz.

The communications assembly 132 includes a controller 136 in the form of one or more integrated circuits, configured to establish and maintain communications links with other devices (e.g., the link 112). The controller 136 includes a baseband processor and one or more transceivers, which may be implemented as distinct hardware elements or integrated on a single circuit. The controller 136 is configured to process outgoing data for transmission via a plurality of antennae 140, four examples 140-1, 140-2, 140-3 and 140-4 (collectively referred to as antennae 140, and generically referred to as an antenna 140) are shown in FIG. 1. Each antenna 140 can include a phased array of antenna elements, for example. In other words, the device 104 is enabled to employ multiple-input, multiple-output (MIMO) functionality to transmit and receive data using multiple input and output streams, in which portions of outgoing or incoming data are transmitted or received via distinct antennae 140. As will be discussed in greater detail below, the controller 136 is configured to process outgoing data for transmission according to selectable encoding modes and modulation schemes prior to providing the processed data to the antennae 140.

The controller 136 is configured to execute various computer-readable instructions (e.g. stored in a memory element integrated with the controller 136 or implemented as a discrete hardware component of the assembly 132 and connected with the controller 136) in the form of a control application 144 for performing the above functions. The control application 144 may be implemented as a software driver deployed to the assembly 132, for example via the processor 120. Through the execution of the application 144, the controller 136 is configured to operate the wireless communications assembly 132 to select a configuration for use in processing payload data to be transmitted to the device 108, and to effect the processing according to the selected configuration.

The processing of data for transmission via the antennae 140 includes, as will be apparent to those skilled in the art, applying forward error correction (FEC) operations to the data, to generate encoded data containing a degree of redundancy that may permit the receiving device 108 to recover portions of the data that are corrupted or omitted in signals received from the device 104. In particular, as discussed below, the controller 136 is configured to perform the above-mentioned encoding according to at least one encoding mode. More specifically, in some embodiments the controller 136 is configured to select between two distinct encoding modes. The encoding modes include (i) a single-encoder mode in which all payload data is processed by a single FEC encoder (e.g. a low-density parity check, or LDPC, encoder), and (ii) a per-stream encoding mode, in which the payload data is parsed into streams (each to be transmitted by a separate antenna 140), and in which each stream is encoded by a distinct FEC encoder.

In some embodiments, certain aspects of the functionality implemented by execution of the application 144 at the controller 136 (up to the entirety of the functionality implemented via the application 144), are implemented as discrete hardware components, either as sub-components of the controller 136 or as circuits distinct from and in communication with the controller 136.

Figure 2:
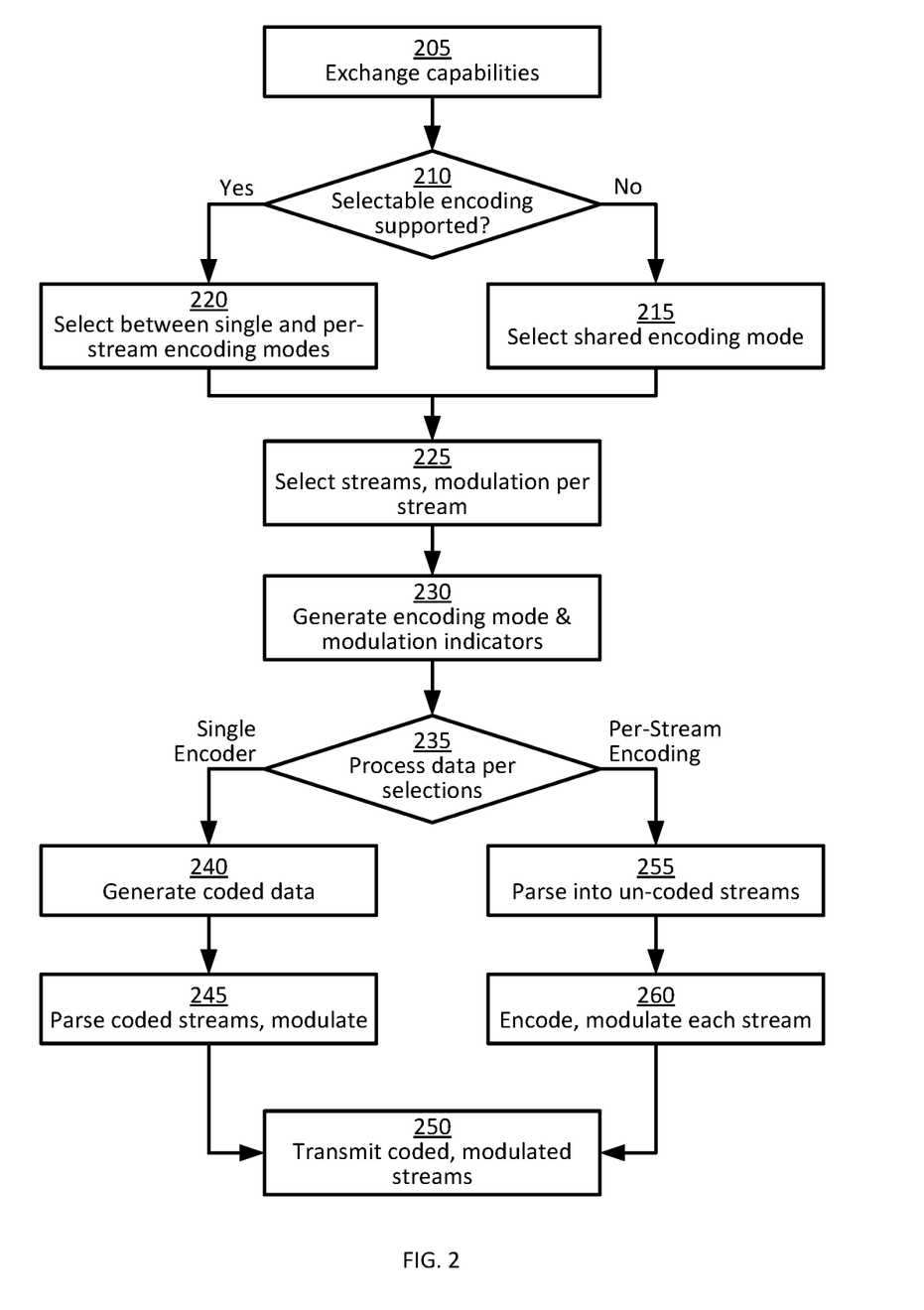
FIG. 2 depicts a method for configurable MIMO processing.

Turning to FIG. 2, a method 200 for configurable MIMO processing is illustrated. The method 200 will be described in connection with its performance on the device 104, as illustrated in FIG. 1. The blocks of the method 200 are performed by the controller 136 of the wireless communications assembly 132, via the execution of the application 144.

At block 205, the controller 136 is configured to exchange capability data with the device 108 (e.g. with a corresponding controller of the device 108). As will be apparent to those skilled in the art, the exchange of capability data can be conducted during the establishment of a communications link (e.g. the link 112 shown in FIG. 1). For example, the devices 104 and 108, during the establishment of the link 112, can exchange messages containing one or more capabilities fields indicating various configuration parameters at the respective devices. The capabilities can include supported data rates, supported communication channels, antenna configurations (e.g. the number of simultaneous MIMO streams supported by the device), and the like.

In addition, the capability data exchanged at block 205 is an indication of whether each device supports one or both of the above-mentioned encoding modes. That is, the device 104 is configured to send an indication to the device 108 of whether the device 104 supports one or both of the single-encoder and per-stream encoding modes. The device 104 is also configured to receive a similar indicator from the device 108, indicating whether the device 108 supports both modes or one or the other. The nature of the indicator is not particularly limited. For example, the indicator can be included in an enhanced directional multi-gigabit (EDMG) capabilities field or subfield of a message.

At block 210, the controller 136 is configured to determine whether both the device 104 itself and the device 108 support selectable encoding. In other words, the controller 136 is configured to determine whether both devices 104 and 108 support both of the above-mentioned encoding modes. When the determination is negative, for example if the device 108 supports only one of the above-mentioned encoding modes, the performance of method 200 proceeds to block 215.

At block 215, the controller 136 is configured to select a shared encoding mode as the active encoding mode; that is, an encoding mode supported by both the device 104 and the device 108. For example, if the device 104 supports both encoding modes and the device 108 supports only a single-encoder mode, the single encoder mode is selected at block 215. In some examples, the device 104 itself may support only one of the encoding modes. For example, if the device 104 supports only the single-encoder mode, the determination at block 210 may automatically be negative, regardless of the indicator received from the device 108. That is, the determination at block 210 may be effectively omitted as the result of the determination is known in advance, and the single-encoder mode may be preconfigured as the active mode. As such, the performance of the method 200 may proceed automatically to block 215, where the single-encoder mode (as the only available mode) is automatically selected (e.g. without any regard as to which modes the device 108 supports). In the event that the device 104 and 108 do not support a shared encoding mode, the performance of the method 200 may terminate.

When the determination at block 210 is affirmative, on the other hand, indicating that both devices 104 and 108 support both of the above-mentioned encoding modes, the controller 136 is configured to proceed to block 220. At block 220, the controller 136 is configured to select one of the encoding modes (i.e. one of single-encoder and per-stream encoding) as the active mode. The selection at block 220 can be based on any one or more of channel rank, signal-to-noise (SNR) ratios on one or more streams employed in a previous transmission (e.g. SNR may be determined based on feedback from the receiving device 108 responsive to the previous transmission), packet error rates and retry rates (e.g. also based on feedback arising from previous transmissions), and beamforming state information.

At block 225, the controller 136 is configured to select a number of transmit streams for transmission of payload data generated at the device 104 for transmission to the device 108. The payload data can include any of a wide variety of data (e.g. multimedia, messaging such as email, instant message data or the like, web pages, and the like), generated via any suitable means, such as the execution of an application by the processor 120. The selection of a number of transmit streams is effected according to any suitable selection operation, examples of which will occur to those skilled in the art. For example, the controller 136 can be configured to select the maximum number of streams supported by both devices 104 and 108. For instance, assuming that the device 108 includes four antennae, the controller 136 can be configured to select four transmit streams at block 225.

At block 225, the controller 136 is also configured to select a modulation scheme for each of the streams. The selection of modulation schemes, as will be apparent to those skilled in the art, is based on one or both of the capabilities data exchanged at block 205 and the condition of the link 112 (e.g. SNR of one or more channels and the like). Any of a wide variety of modulation schemes can be selected at block 225, including binary phase shift keying (BPSK), quadrature phase shift keying (QPSK), higher-order phase shift keying such as 8-PSK, and quadrature amplitude modulation (QAM) schemes such as 16-QAM and 64-QAM, and the like. The controller 136 can be configured to select a single modulation scheme for each stream, or to select distinct modulation schemes for some or all of the streams.

At block 230, the controller 136 is configured to generate encoding mode and modulation indicators for inclusion in the data to be transmitted to the device 108. The indicators can be generated as fields or subfields in header data to be concatenated with the payload data before transmission. For example, as will be apparent to those skilled in the art, the header data can include modulation and coding scheme (MCS) indicators corresponding to each stream indicating which modulation scheme and FEC code rate is employed to process the payload data. The MCS indicators are typically index values corresponding to one of a number of predefined sets of configuration parameters (e.g. a modulation type, the number of streams the modulation type is applied to, an FEC code rate, a data rate and the like). The encoding mode can be indicated, for example, as a bit flag in the header data. For example, a value of zero in the bit flag can indicate that the single-encoder mode was employed to apply FEC encoding to the payload data, while a value of one in the bit flag can indicate that the per-stream encoding mode was employed. In other examples, the encoding mode indicator can be combined with the above-mentioned MCS indicators. For example, the above-mentioned predefined sets of configuration parameters can be extended to include indications of an encoding mode corresponding to each MCS index.

At block 235, the controller 136 is configured to process the payload data for transmission according to the selections at blocks 215 or 220, as well as block 225. As seen in FIG. 2, the sequence of operations employed in the processing of payload data for transmission varies based on the encoding mode selected at blocks 215 or 220. In particular, when the single-encoder mode is selected, the performance of method 200 proceeds to block 240, followed by block 245. In brief, at block 240 the controller 136 is configured to generate coded payload data (that is, the payload data encoded according to a suitable FEC mechanism, such as the above-mentioned LDPC encoding process). At block 245, the coded payload data is parsed into the selected number of streams, and the selected modulation schemes are applied to the coded streams. In other words, through blocks 240 and 245 the application of FEC encoding precedes streaming and modulation.

Figure 3:
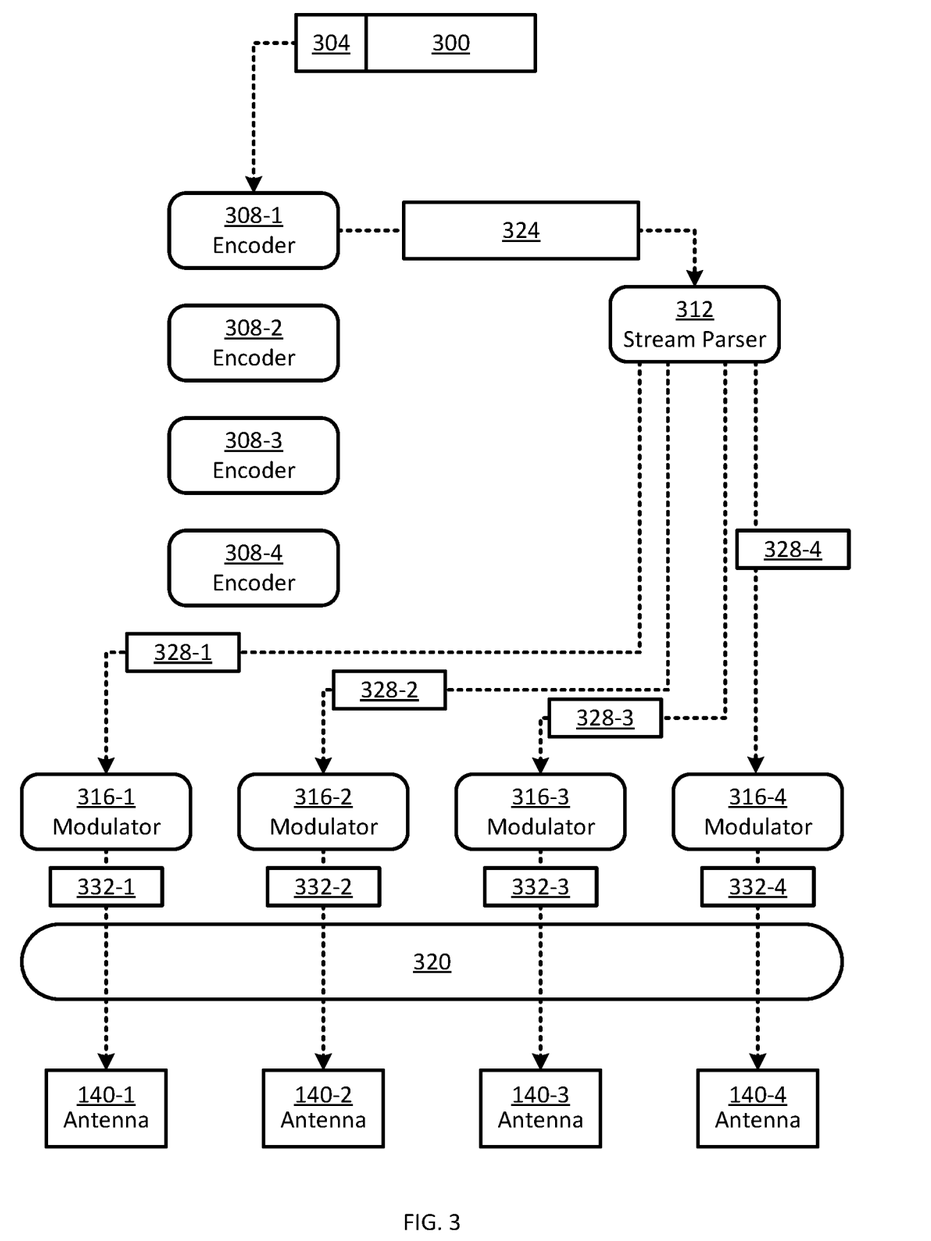
FIG. 3 depicts a transmitter architecture implementing a performance of the method of FIG. 2.

Referring now to FIG. 3, the performance of blocks 240 and 245 will be discussed in greater detail. FIG. 3 illustrates payload data 300, as well as header data 304 (including the above-mentioned modulation and encoding indicators). FIG. 3 also illustrates various components of the application 144 in greater detail (which may also be implemented, as noted earlier, as one or more dedicated hardware components). Specifically, the application 144 includes four encoders 308-1, 308-2, 308-3 and 308-4. In the present example, the encoders 308 are LDPC encoders. Each encoder 308 may be implemented as one or more parallel hardware components, executable processes, or the like, constituting a single logical encoder. When a given encoder 308 includes a plurality of sub-components (e.g. a plurality of parallel encoder circuits), a configurable subset of the sub-components may be employed, for example depending on the data rate at which the payload data 300 is to be transmitted. For example, at higher data rates a greater number of such sub-components may be activated while at lower data rates a lower number of such sub-components may be activated.

The application 144 also includes a stream parser 312 and a number of modulators 316 corresponding to the number of antennae 140. Thus, in the present example, the application 144 includes four modulators 316-1, 316-2, 316-3 and 316-4. The application 144 can also include a plurality of additional processing components implemented as executable processes, hardware components or both, including interleavers, digital-to-analog (DAC) converters, and the like, generally indicated at 320.

At block 240, the controller 136 is configured to direct the payload data 300 and header 304 to a single encoder (the encoder 308-1 in the illustrated example) for generation of coded data 324. The coded data 324, which as is apparent from FIG. 3 consists of a single stream, is then provided to the stream parser 312 for generation of coded streams of data at block 245. Specifically, in the example illustrated in FIG. 3, the stream parser 312 divides the coded data 324 into four coded streams 328-1, 328-2, 328-3 and 328-4. Each coded stream 328 contains a portion of the payload data 300 in an encoded form, and each coded stream 328 is directed to a distinct modulator 316 for modulation prior to transmission via the antennae 140 at block 250 (typically under the control of additional processing components 320). That is, the modulators 316 generate coded, modulated streams 332-1, 332-2, 332-3 and 332-4 for any suitable further processing and transmission via respective antenna 140.

Returning to FIG. 2, when the selected encoding mode is the per-stream encoding mode, performance of the method 200 proceeds from block 235 to block 255 rather than to block 240. At block 255, the controller 136 is configured to generate the selected number of streams of un-coded data (that is, each stream including a portion of the payload data prior to encoding). At block 260, the controller 136 is configured to generate, from the un-coded streams, a plurality of encoded, modulated streams for transmission at block 250.

Figure 4:
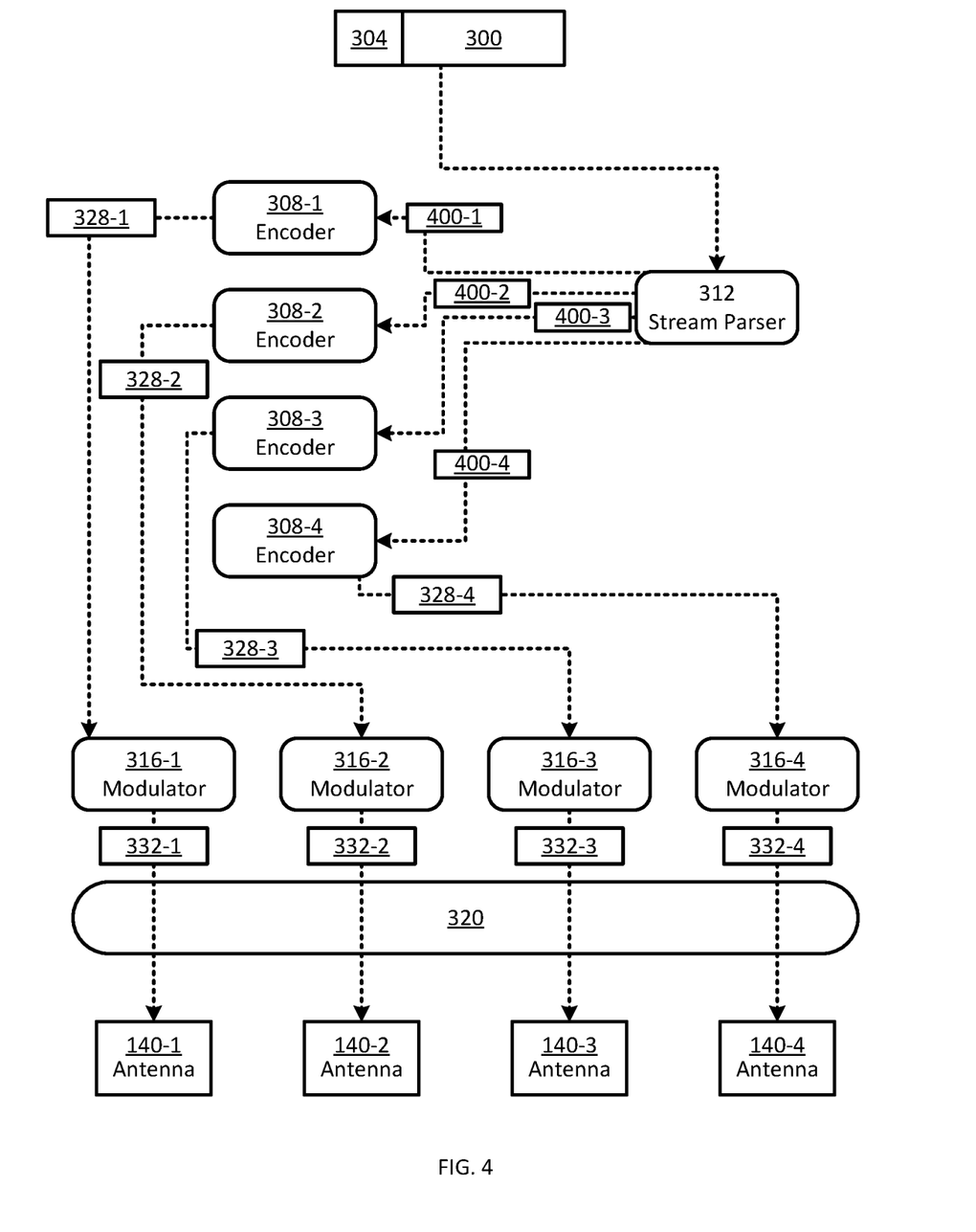
FIG. 4 depicts a transmitter architecture implementing another performance of the method of FIG. 2.

Turning now to FIG. 4, the architecture of FIG. 3 is illustrated in conjunction with the performance of blocks 255 and 260. The payload data 300 and header data 304 are illustrated in FIG. 4, but are provided to the stream parser 312 rather than to the encoder 308-1 (as illustrated in FIG. 3). Thus, the stream parser 312 is configured to generate a plurality of un-coded streams 400-1, 400-2, 400-3 and 400-4 from the payload data 300 at block 255. The un-coded streams 400 are then provided to respective encoders 308 for generation of the coded streams 328 at block 260. The coded streams 328 are provided to respective modulators 316 as discussed above in connection with FIG. 3 for generation of modulated, coded streams 332 to conclude the performance of block 260. Following the generation of modulated, coded streams 332, the modulated, coded streams 332 are transmitted via the processing components 320 and the antennae 140.

As will now be apparent, the device 108, upon receiving the transmitted streams from the device 104, is configured to demodulate the streams via one or more demodulators, and to apply the streams to one or more decoders, based on the encoding mode selected at blocks 215 or 220 and signaled in the header 304, to decode and reconstitute the payload data 300. For example, when the header 304 indicates that per-stream encoding was employed at the device 104, the receiving device 108 is configured to direct each received stream to a distinct decoder. When the header 304 indicates that the single-encoder mode was employed at the device 104, the device 108 is configured to direct all received streams to a single decoder.

The implementation of selectable encoding modes as described above may permit devices operating according to a shared standard (e.g. 802.11ay) to better adapt their communications to environmental factors, as well as the capabilities of the participating devices.

The scope of the claims should not be limited by the embodiments set forth in the above examples, but should be given the broadest interpretation consistent with the description as a whole.

The invention claimed is:

1. A method in a transmitter station, comprising:
generating payload data for transmission to a receiver station via a plurality of antennae of the transmitter station;
selecting a number of transmit streams for transmission of the payload data;
selecting respective modulation schemes for each of the transmit streams;
according to the modulation schemes and to an active one of (i) a single-encoder mode and (ii) a per-stream encoding mode, generating the number of coded, modulated transmit streams by, when the active one of the single-encoder mode and the per-stream encoding mode is per-stream encoding mode:
providing the payload data to a stream parser for generation of the number of un-coded transmit streams;
providing the un-coded transmit streams to respective encoders for generation of the number of coded transmit streams; and
providing the coded transmit streams to respective modulators for generation of the coded, modulated transmit streams;
wherein each coded, modulated transmit stream contains a portion of the payload data; and
providing the coded, modulated transmit streams to respective ones of the antennae for transmission to the receiver station.

2. The method of claim 1, further comprising:
prior to generating the coded, modulated transmit streams, selecting the active one of the encoding modes.

3. The method of claim 2, further comprising, when the active one of the single-encoder mode and the per-stream encoding mode is the single-encoder mode:

providing the payload data to a single encoder for generation of coded payload data;
providing the coded payload data to a stream parser for generation of the number of coded transmit streams; and
providing the coded transmit streams to respective modulators for generation of the coded, modulated transmit streams.

4. The method of claim 3, wherein the single encoder is a low-density parity check (LDPC) encoder.

5. The method of claim 1, wherein the transmitter station includes only a single encoder; and wherein the single-encoder mode is preconfigured as the active one of the single-encoder mode and the per-stream encoding mode.

6. The method of claim 1, further comprising:
concatenating header data with the payload data, the header data including an indicator of the active one of the single-encoder mode and the per-stream encoding mode.

7. The method of claim 6, wherein the indicator is a field in the header data containing a bit flag indicating the active one of the single-encoder mode and the per-stream encoding mode.

8. A transmitter station, comprising:
a plurality of antennae; and
a controller connecting to the plurality of antennae, the controller configured to:
generate payload data for transmission to a receiver station via the plurality of antennae;
select a number of transmit streams for transmission of the payload data;
select respective modulation schemes for each of the transmit streams;
according to the modulation schemes and to an active one of (i) a single-encoder mode and (ii) a per-stream encoding mode, in order to generate the number of coded, modulated transmit streams when the active one of the single-encoder mode and the per-stream encoding mode is per-stream encoding mode:
provide the payload data to a stream parser for generation of the number of un-coded transmit streams;
provide the un-coded transmit streams to respective encoders for generation of the number of coded transmit streams; and
provide the coded transmit streams to respective modulators for generation of the coded, modulated transmit streams; wherein each coded, modulated transmit stream contains a portion of the payload data; and
provide the coded, modulated transmit streams to respective ones of the antennae for transmission to the receiver station.

9. The transmitter station of claim 8, wherein the controller is further configured to:
prior to generating the coded, modulated transmit streams, select the active one of the encoding modes.

10. The transmitter station of claim 9, wherein the controller is further configured to, when the active one of the single-encoder mode and the per-stream encoding mode is the single-encoder mode:
provide the payload data to a single encoder for generation of coded payload data;
provide the coded payload data to a stream parser for generation of the number of coded transmit streams; and provide the coded transmit streams to respective modulators for generation of the coded, modulated transmit streams.

11. The transmitter station of claim 10, wherein the single encoder is a low-density parity check (LDPC) encoder.

12. The transmitter station of claim 8, wherein the transmitter station includes only a single encoder; and wherein the single-encoder mode is preconfigured as the active one of the single-encoder mode and the per-stream encoding mode.

13. The transmitter station of claim 8, wherein the controller is further configured to:
concatenate header data with the payload data, the header data including an indicator of the active one of the single-encoder mode and the per-stream encoding mode.

14. The transmitter station of claim 13, wherein the indicator is a field in the header data containing a bit flag indicating the active one of the single-encoder mode and the per-stream encoding mode.

15. A non-transitory computer-readable medium storing a plurality of instructions executable by a controller of a transmitter station for:
generating payload data for transmission to a receiver station via a plurality of antennae of the transmitter station;
selecting a number of transmit streams for transmission of the payload data;
selecting respective modulation schemes for each of the transmit streams;
according to the modulation schemes and to an active one of (i) a single-encoder mode and (ii) a per-stream encoding mode, generating the number of coded, modulated transmit streams by, when the active one of the single-encoder mode and the per-stream encoding mode is per-stream encoding mode;
provide the payload data to a stream parser for generation of the number of un-coded transmit streams;
provide the un-coded transmit streams to respective encoders for generation of the number of coded transmit streams; and
provide the coded transmit streams to respective modulators for generation of the coded, modulated transmit streams; wherein each coded, modulated transmit stream contains a portion of the payload data; and
providing the coded, modulated transmit streams to respective ones of the antennae for transmission to the receiver station.

* * * * *